United States Patent [19]

Bacon et al.

[11] Patent Number: 5,234,153
[45] Date of Patent: Aug. 10, 1993

[54] PERMANENT METALLIC BONDING METHOD

[75] Inventors: Donlad D. Bacon, Somerset; Avishay Katz, Westfield; Chien-Hsun Lee, North Plainfield; King L. Tai, Berkeley Heights, all of N.J.; Yiu-Man Wong, Wescosville, Pa.

[73] Assignee: AT&T Bell Laboratories, Murray Hill, N.J.

[21] Appl. No.: 938,195

[22] Filed: Aug. 28, 1992

[51] Int. Cl.$^5$ ............... B23K 35/26; B23K 31/02; H01L 21/44

[52] U.S. Cl. .................. 228/122.1; 228/226; 228/262.8; 228/262.31; 437/190

[58] Field of Search ............... 228/123, 121, 263.12, 228/263.13, 226; 437/190

[56] References Cited

U.S. PATENT DOCUMENTS

| | | | |
|---|---|---|---|
| 3,396,454 | 8/1968 | Murdock et al. | 228/263.12 |
| 4,290,079 | 9/1981 | Carpenter et al. | 357/71 |
| 4,360,142 | 11/1982 | Carpenter et al. | 228/123 |
| 4,757,934 | 7/1988 | Greenstein | 228/263.12 |
| 4,772,935 | 9/1988 | Lawler et al. | 357/71 |
| 4,840,302 | 6/1989 | Gardner et al. | 228/123 |

Primary Examiner—Richard K. Seidel
Assistant Examiner—Jeffrey T. Knapp
Attorney, Agent, or Firm—David I. Caplan

[57] ABSTRACT

A laser device is bonded to a diamond submount by means of a procedure including (1) codepositing an auxiliary layer, on a layer of barrier metal that has been deposited overlying the submount, followed by (2) depositing a wetting layer on the auxiliary layer, and (3) by depositing a solder layer comprising alternating metallic layers, preferably of gold and tin sufficient to form an overall tin-rich gold-tin eutectic composition. The barrier metal is typically W, Mo, Cr, or Ru. Prior to bonding, a conventional metallization such as Ti-Pt-Au (three layers) is deposited on the laser device's bottom ohmic contact, typically comprising Ge. Then, during bonding, the solder layer is brought into physical contact with the laser device's metallization under enough heat and pressure, followed by cooling, to form a permanent joint between them. The thickness of the solder layer is advantageously less than approximately 5 $\mu$m. The wetting layer is preferably the intermetallic compound $Ni_3Sn_4$, and the auxiliary layer is formed by codepositing the metallic components of this intermetallic together with the barrier metal.

20 Claims, 1 Drawing Sheet

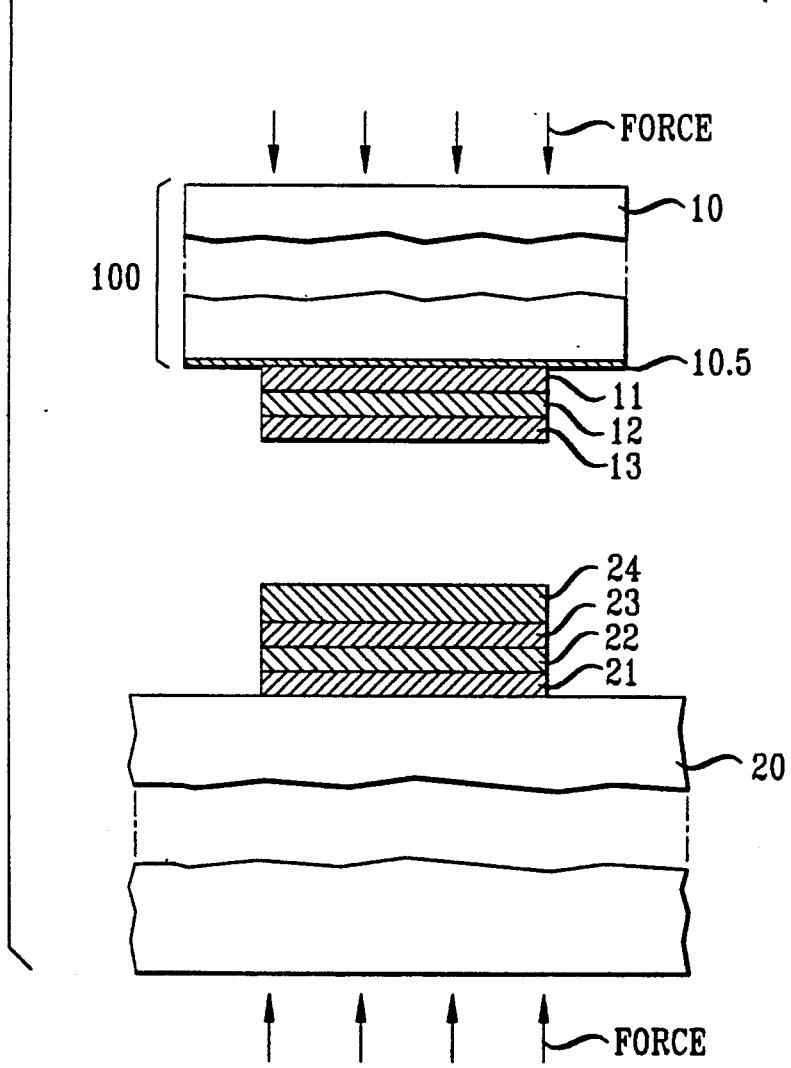

PERMANENT METALLIC BONDING METHOD

FIELD OF THE INVENTION

This invention relates to bonding methods, and more particularly to those bonding methods that use metallic bonding materials for forming permanent joints between two bodies or devices.

BACKGROUND OF THE INVENTION

During operation of a semiconductor laser device—i.e., when it is generating optical radiation-it also generates relatively large amounts of heat that must be quickly and efficiently conducted away from the device, lest its temperature rise to an undesirably high level and its useful device lifetime consequently be undesirably reduced.

U.S. Pat. No. 4,772,935 teaches a process for thermal-compression bonding of a silicon integrated circuit die to a package comprising a header. The process utilizes successive formations on a major surface of a silicon wafer (substrate), prior to its being cut into a plurality of dies, the following successive layers: (1) an adhesion layer of titanium; (2) a barrier layer, preferably of tungsten; (3) a bonding layer, preferably of gold. Also, a stress-relieving layer, preferably of gold, can be formed earlier between the adhesion layer of titanium and the major surface of the wafer. Thereafter, the substrate is cut into the plurality of dies, each of which is bonded, for example, to a ceramic header ("submount"). Prior to the die's thus being bonded to the header, a major surface of the header is coated with a layer of gold that, in turn, is coated with a "binding" layer of solder, preferably a gold-tin eutectic in order to supply a desirable bonding material for the ultimate bonds (joint) between the substrate and the header.

The purpose of the aforementioned adhesion layer is to promote adhesion of the tungsten barrier layer to the substrate. The stated purpose of the barrier layer is to suppress migration of silicon from the substrate into the originally eutectic binding layer of solder: such migration would cause an undesirable increase in the melting temperature of the layer of solder and hence a required undesirably high temperature rise in the wafer during the thermal-compression bonding process (during which the binding layer of solder must be melted to wet the surface to be bonded). The stated purpose of the bonding layer of gold is to protect the barrier layer from oxidation that would weaken the resulting bond.

In the aforementioned patent, the thickness of the layer of solder was reported to be 0.5 mil to 1.0 mil—i.e., approximately 13 $\mu$m to 25 $\mu$m. Such a relatively large thickness, regardless of relatively small thicknesses of the other layers, is not desirable in the context of bonding a relatively high power (over 100 milliwatt) laser to a submount: such a laser requires a significantly higher thermal conductance, and hence significantly smaller thickness, of the entire resulting bond between the laser and its submount.

However, when a gold-tin solder layer is made desirably thin from the standpoint of good and sufficient thermal conductance—i.e., about 4 or 5 $\mu$m or less—then exposed surface regions of the solder layer suffer from premature freezing (solidification) during the bonding process when the solder is heated above its melting (=freezing) temperature, namely above 280° C. in cases where the gold-tin solder has a eutectic composition (gold: 80 per centum by weight; tin: 20 per centum by weight) and hence has a desirable minimum melting temperature. This premature freezing is caused by migration of tin away from the exposed surface of the solder layer (initially having a eutectic or even a tin-rich nearly eutectic composition), whereby (because the solder's surface regions no longer have the eutectic or nearly eutectic compositions) the melting point of the solder's surface regions dramatically increases. More specifically, as the tin component decreases in the neighborhood of the eutectic composition on its tin-poor side, the melting temperature initially increases by about 30° C. per centum (by weight) decrease in the tin component. Consequently, surface regions of the solder undesirably solidify ("freeze") during bonding, because the bonding process cannot be performed at a temperature that is high enough to prevent this freezing and at the same time that is low enough so as not to injure the device during this bonding procedure. The thinner the solder layer, the more readily it prematurely freezes: the relative composition of a thinner layer is more sensitive to absolute changes of a component than is a thicker layer.

The aforementioned premature freezing of the solder is undesirable because it causes poor "wetting" of the surface of the gold bonding layer by the solder and consequently poor bonding of the device to the submount. Thus, during subsequent device operation, the resulting poor thermal conductance of the resulting bond (caused by the poor "wetting") tends to cause injurious overheating of the device, and the resulting poor mechanical adhesion property of the bond tends to allow the device to detach from the submount.

On the other hand, other solders—such as indium, lead-tin, lead-indium, tin-indium, lead-indium-silver—have lower melting temperatures than that of a gold-tin eutectic, and hence their use would not injure the device during bonding. But, they have undesirably much lower Young's moduli of elasticity as compared with that of gold-tin solder (by a factor of 10 or more), and hence these other solders tend to produce bonds that are mechanically less stable (rigid). Also bonds made from these other solders tend to have undesirably higher creep, such higher creep being associated with the relatively low melting temperatures of these other solders as compared with that (280° C. or more) of a gold-tin solder.

Another shortcoming with the technique described in the aforementioned patent stems from poor adhesion of the tungsten barrier layer to the gold-tin solder. Therefore it would be desirable to have a bonding method, preferably using gold-tin solder, that mitigates the above-mentioned shortcomings of prior art.

SUMMARY OF THE INVENTION

This invention provides, in a specific embodiment thereof, a method of bonding a first body to a second body, including the steps of:

(a) forming, overlying at least a portion of a surface of the first body, a barrier layer composed of a barrier metal such as tungsten, molybdenum, chromium, or ruthenium;

(b) codepositing, overlying the barrier layer, an auxiliary layer composed of the barrier metal together with first and second metals, such as nickel and tin, respectively;

(c) forming, overlying the auxiliary layer, a wetting layer composed of the first and second metals; and (d) forming a layer of solder overlying the wetting layer.

As used hereinafter, the term "barrier metal" refers in general to a metal that chemically reacts with every component of the solder (or of the surface of the first body) only very slowly: that is to say, the barrier layer prevents any component of the solder (or of the substrate) from penetrating through it for at least 5 minutes at the elevated temperatures that are used for melting the solder during a subsequent bonding process.

It is further advantageous, in order to complete the bonding, to heat the layer of solder above its melting point for a predetermined time, while mechanically pressing the layer of solder against a metallic coating located on at least a portion of a surface of the second body. After cooling, the first and second bodies are permanently bonded together, as is desired.

Advantageously also, the first and second metals form a stable intermetallic compound phase at least during the subsequent bonding process (i.e., at least when the solder is melted). For example, a stable intermetallic compound phase of nickel-tin is thus formed by $Ni_x Sn_y$ with $x=3$, and $y=2$ or $y=4$, or a mixture of $x=3$ with $y=2$ and $y=4$. The preferred value of $y=4$.

It is also advantageous that the layer of solder is a gold-tin solder, and the wetting layer has a nickel-tin composition that contains tin in an amount that is sufficient to cause the wetting layer to form a sufficiently stable intermetallic nickel-tin compound at least during the bonding process—so as to prevent a change in the ratio of gold to tin contained in the layer of solder, when the solder is melted during the bonding, that would be so great as to increase the melting temperature of the solder significantly. Preferably the melting temperature of the solder then increases during the bonding process by no more than approximately 20 C. degrees. In this way, premature freezing of the solder during the bonding process is avoided.

It is further advantageous that the layer of solder comprises alternating layers of gold and tin. It is yet further advantageous that the layer of gold-tin solder is a tin-rich gold-tin eutectic, whereby the solder when melted is less viscous than a (precise) gold-tin eutectic. In this way, the melted solder can facilitate self-alignment during the bonding process—i.e., lateral self-alignment of the resulting joining together of at least the portion of the surface of the first body to at least the portion of the surface of the second body.

As used herein, the term "tin-rich gold-tin eutectic" refers to an alloy composition of gold and tin in which the ratio of tin to gold by weight is in the approximate range of 21 to 23 percentum, the ratio for a (precise) eutectic being 20 percentum, and the ratio for an approximate eutectic being in the approximate range of 19 to 21 percentum, preferably greater than 20 percentum. If self-alignment is not needed or desired, then the solder can be a more nearly precise gold-tin eutectic, whereby somewhat lower temperatures can be used for melting the solder during the bonding process. It is yet further advantageous that the layer of solder originally have a structure formed by multiple alternating layers of tin and gold, preferably starting and ending with gold, having an overall composition of a tin-rich eutectic. In this way, not only does the layer of solder avoid prematurely freezing by reason of its original structure and composition, and not only is the tin-rich gold-tin eutectic layer of solder when melted advantageously less viscous (for ease of self-alignment) than a gold-tin eutectic, but it also can be made to have a total thickness of less than approximately 5 $\mu$m or perhaps even 4 $\mu$m or less (for the desired good thermal conductance).

The second body is typically a laser device that comprises a laser chip. It is further advantageous that in such a case the first body be diamond or silicon coated with a metallic barrier layer such as essentially tungsten—in order to prevent the nickel-tin from contacting the first body, since the nickel-tin does not adhere well to the diamond or silicon and hence would otherwise weaken the joint.

Although it should be understood that the correctness of the theory is not essential to the success of the invention, it is believed that the (codeposited) auxiliary layer, at least partly because it contains tin and nickel as does the wetting layer, forms a mechanically strong and chemically stable bond owing to a resulting recrystallized metallic micro-fiber network that forms with the wetting layer after heating the layer of solder during bonding and subsequent cooling. It is also believed that, at least partly because the wetting layer contains tin as does the solder, the layer of solder desirably wets the wetting layer. It is further believed that, at least partly because the auxiliary layer also contains the barrier metal, the auxiliary layer forms a good bond with the barrier layer.

More generally the solder can advantageously be a mixture of metals x and y, the wetting layer can be a mixture of metals z and y, the auxiliary layer can be a codeposited layer of the barrier metal and both the metals z and y—provided that the barrier metal does not significantly react (exchange places) with any of the metals x, y, and z; and provided also that the metal z does not significantly react with the metal x, although x and y may interact. The term "significantly react" is used here to describe a reaction that would change the melting temperature of the solder during the bonding time interval by such an amount that the solder would undesirably prematurely freeze during the bonding. Also, it is advantageous that the ratio of the amounts of the metals z and y—at least in the wetting layer—are such that they form a stable intermetallic compound, at least during the bonding process.

BRIEF DESCRIPTION OF THE DRAWING

FIG. 1 is a cross-section view of first and second bodies being bonded together in accordance with a specific embodiment of the invention.

DETAILED DESCRIPTION

A laser device 100 (FIG. 1) is to be bonded to a submount body 20. Typically, this submount 20 is essentially silicon or diamond, with CVD (chemically vapor deposited) diamond being preferred. The laser device 100 typically comprises, as known in the art, a III-V semiconductor laser chip 10, such as gallium arsenide, having a bottom ohmic contact layer 10.5 of germanium, with metallization on a portion thereof ("metallization pad") typically consisting essentially of a titanium layer 11, a platinum layer 12, and a gold layer 13. The cross section of the pad is typically approximately 40 $\mu$m $\times$ 40 $\mu$m. In any event, it is preferred that the final layer 13 is gold.

On a portion of the top surface of the diamond submount 20 are successively located a tungsten (barrier) layer 21, a (codeposited) auxiliary layer 22 of nickel-tin and tungsten, a nickel-tin (wetting) layer 23 and a solder layer 24. The cross section of this portion of the top surface of the diamond submount 20 is also typically approximately 40 μm×40 μm. Advantageously, the solder layer 24 consists essentially of at least five alternating layers of gold and tin, starting with gold contacting the top surface of the nickel-tin layer 23. Solder layers similar to this, comprising alternating layers of gold and tin, have been disclosed in copending patent application Ser. No. 07/792559.

In order to fabricate the metallization on the surface of the submount 20, the tungsten layer 21 is deposited by sputtering from a tungsten target to a thickness of typically approximately 0.05 μm. In order to promote adhesion of this tungsten layer 21 to the submount 20, an adhesion layer (not shown), typically of titanium having a thickness of approximately 0.1 μm can be deposited directly on the top surface of the submount 20, and then the tungsten layer 21 can be deposited on the top surface of the titanium layer. Next, the auxiliary layer 22 is deposited, typically to a thickness in the approximate range of 0.3 μm to 2.0 μm, as by means of cosputtering nickel-tin from a nickel-tin intermetallic alloy target (or simultaneously from separate nickel and tin targets) and tungsten from a tungsten target. The cosputtering is arranged so that the auxiliary layer 22 has an atomic ratio of tungsten to nickel-tin that is in the approximate range of 1/5 to 5/1, preferably approximately 1/1. The stoichiometry of the nickel-tin in the auxiliary layer 22 is preferably at least approximately $Ni_3Sn_4$. Instead of the tungsten target, other targets can be used such as molybdenum, chromium, or ruthenium.

Next, the nickel-tin wetting layer 23 is deposited, typically by means of sputtering from a nickel-tin intermetallic alloy target, to a thickness of typically approximately 0.1 μm. Alternatively, cosputtering from separate nickel and tin targets can be used for this purpose.

The solder layer 24 is then deposited by alternating evaporation of gold and tin layers, advantageously such that the overall composition of the solder layer 24 is a tin-rich eutectic—such as 25 weight percent tin, 75 weight percent gold (a gold-tin eutectic containing only 20 weight percent tin). More specifically, for example, first a gold layer is evaporated on the top surface of the wetting layer 23 to a thickness of approximately 0.9 μm, followed by evaporating a tin layer to a thickness of approximately 0.5 μm on the top surface of this gold layer, and then evaporating another gold layer to a thickness of approximately 0.8 μm on the top surface of this tin layer, followed by another tin layer to a thickness of approximately 0.7 μm, and yet another gold (capping) layer to a thickness of approximately 0.1 μm. Further alternating layers of tin and gold, preferably ending with gold, optionally can be subsequently evaporated on the top surface of the then exposed layer of gold.

In order to bond the laser device 100 to the submount 20, the exposed surfaces of the gold layer 13 and the solder layer 24 are pressed together by means of compressive forces F at elevated temperatures, typically approximately in the approximate range of 320° C. to 340° C., for a time duration in the approximate range of 6 seconds and 8 seconds. The compressive forces F can be produced simply by the weight of the laser device 100, which typically produces a pressure of approximately $10^6$ Pascal. Because of the relatively low viscosity of the tin-rich eutectic composition of the solder layer 24, lateral self-alignment of the bonding of the device 100 to the submount 20 is enhanced. Typically the solder in heated above its melting temperatures only after the laser device has been pre-heated to a temperature of approximately 250° C. and after the compressive forces F have been applied.

Although the invention has been described in detail with respect to a specific embodiment, various modifications can be made without departing from the scope of the invention. For example, instead of laser devices, other devices or bodies such as semiconductor integrated circuit devices, can similarly be bonded to other or the same kinds of submounts as those described above.

We claim:

1. A process of bonding a first body to a second body, including the steps of:
   (a) forming, overlying at least a portion of a surface of the first body, a barrier layer composed of a barrier metal;
   (b) codepositing, overlying the barrier layer, an auxiliary layer composed of first and second metals together with the barrier metal;
   (c) forming, overlying the auxiliary layer, a wetting layer composed of the first and second metals; and
   (d) forming a layer of solder overlying the wetting layer.

2. The process of claim 1 in which first and second metals form a stable intermetallic compound at least during the process of bonding.

3. The process of claim 1 in which the first and second metals respectively are nickel and tin.

4. The process of claim 3 in which the layer of solder is at least approximately a gold-tin eutectic or is a tin-rich gold-tin eutectic.

5. The process of claim 4 in which the barrier metal is essentially tungsten.

6. The process of claim 5 in which step (d) comprises:
   (1) depositing a first gold layer on the wetting layer;
   (2) depositing a first tin layer on the first gold layer;
   (3) depositing a second gold layer on the first tin layer;
   (4) depositing a second tin layer on the second gold layer; and
   (5) depositing a third gold layer on the second tin layer.

7. The process of claim 6 in which the overall thickness of the layer of solder is less than approximately 5 μm.

8. The process of claim 5 further including the step of heating the layer of solder above its melting temperature, and in which the wetting layer contains tin in an amount that is sufficient to prevent a change in the ratio of gold to tin contained in the layer of solder when heated above its melting temperature that would be so great as to change its melting temperature by more than approximately 20 C. degrees.

9. The process of claim 5 further comprising the steps of pressing the layer of solder against a metallic coating located on at least a portion of the surface of the second body, and heating the layer of solder above its melting temperature.

10. A process of bonding a first body to a second body in accordance with claim 3 in which the barrier metal is essentially tungsten.

11. The process of claim 10 in which the layer of solder comprises gold and tin.

12. The process of claim 11 in which thickness of the layer of solder is less than approximately 5 μm.

13. The process of claim 11 further including the step of heating the layer of solder above its melting temperature, and in which the wetting layer contains tin in an amount that is sufficient to prevent a change in the ratio of gold to tin contained in the layer of solder when heated above its melting temperature that would be so great as to change its melting temperature by more than approximately 20 C. degrees.

14. The process of claim 10 further comprising the steps of pressing the layer of solder against a metallic coating located on at least a portion of the surface of the second body, and heating the layer of solder above its melting temperature.

15. A process of bonding a first body to a second body in accordance with claim 3 in which the barrier metal is molybdenum, chromium, or ruthenium.

16. The process of claim 15 in which the layer of solder is at least approximately a gold-tin eutectic or is a tin-rich gold-tin eutectic.

17. The process of claim 16 in which step (d) comprises
   (1) depositing a first gold layer on the wetting layer;
   (2) depositing a first tin layer on the first gold layer;
   (3) depositing a second gold layer on the first tin layer;
   (4) depositing second tin layer on the second gold layer; and
   (5) depositing a third gold layer on the second tin layer.

18. The process of claim 17 further including the step of heating the layer of solder above its melting temperature, and in which the wetting layer contains tin in an amount that is sufficient to prevent a change in the ratio of gold to tin contained in the layer of solder when heated above its melting temperature that would be so great as to change its melting temperature by more than approximately 20 C. degrees.

19. The process of claim 16 further including the step of heating the layer of solder above its melting temperature, and in which the wetting layer contains tin in an amount that is sufficient to prevent a change in the ratio of gold to tin contained in the layer of solder when heated above its melting temperature that would be so great as to change its melting temperature by more than approximately 20 C. degrees.

20. The process of claim 1 further comprising the steps of pressing the layer of solder against a metallic coating located on at least a portion of the surface of the second body, and heating the layer of solder above its melting temperature.

* * * * *